United States Patent
Sandhu

(10) Patent No.: US 6,348,706 B1
(45) Date of Patent: Feb. 19, 2002

(54) METHOD TO FORM ETCH AND/OR CMP STOP LAYERS

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/531,680

(22) Filed: Mar. 20, 2000

(51) Int. Cl.$^7$ .......................... H01L 27/88; H01L 29/44
(52) U.S. Cl. ........................................ 257/296; 257/638
(58) Field of Search .............................. 257/296, 632, 257/634, 635, 638, 644, 650; 438/778, 783, 787

(56) References Cited

U.S. PATENT DOCUMENTS

| | | | | |
|---|---|---|---|---|
| 4,016,017 A | * | 4/1977 | Aboaf et al. | 438/441 |
| 4,474,831 A | * | 10/1984 | Downey | 438/800 |
| 5,302,233 A | | 4/1994 | Kim et al. | 156/636 |
| 5,448,097 A | * | 9/1995 | Mizushima et al. | 257/435 |
| 5,485,035 A | | 1/1996 | Lin et al. | 257/637 |
| 5,633,211 A | * | 5/1997 | Imai et al. | 438/760 |
| 5,641,545 A | | 6/1997 | Sandhu | 427/573 |
| 5,804,506 A | | 9/1998 | Haller et al. | 438/649 |
| 5,814,564 A | | 9/1998 | Yao et al. | 438/723 |
| 5,858,869 A | | 1/1999 | Chen et al. | 438/597 |
| 5,872,052 A | | 2/1999 | Iyer | 438/622 |
| 5,872,058 A | | 2/1999 | Van Cleemput et al. | 438/692 |
| 5,880,007 A | * | 3/1999 | Varian et al. | 438/427 |
| 5,985,770 A | | 11/1999 | Sandhu et al. | 438/787 |

FOREIGN PATENT DOCUMENTS

| | | | | |
|---|---|---|---|---|
| EP | 0 875 929 A2 | 11/1998 | ......... | H01L/21/768 |
| EP | 0 875 930 A2 | 11/1998 | ......... | H01L/21/768 |

OTHER PUBLICATIONS

Sabine Penka, et al., Integration Aspects of flowfill and Spin–on–Glass Process for Sub–0.35um Interconnects, Proceedings of the IEEE 1998 International Interconnect Technology Conference, at 271–273 (1998).
U. Höckele, et al., Flowfill–Process as a New Concept for Inter–Metal–Dielectrics, Materials Science Forum, at 235–238 (1998).
K. Beekmann, et al., Sub–micron Gap Fill and In–Situ Planarisation using Flowfill® Technology, *Conference Proceedings ULSI XI, Materials Research Society*, at 137–143 (1996).
A. Hass Bar–Ilan, et al., A comparative study of sub–micron gap filling and planarization techniques, Proceedings of the SPIE—The International Society For Opitical Engineering, at 277–288 (1995).
Wolf et al., Silicon Processing for the VLSI Era vol.1:Process Technology, 1986, Lattice Press, California, pp. 190.*

* cited by examiner

*Primary Examiner*—Olik Chaudhuri
*Assistant Examiner*—Marcos D. Pizarro-Crespo
(74) *Attorney, Agent, or Firm*—Charles Brantley

(57) ABSTRACT

In a DRAM fabrication process, a first oxide is provided over a transistor gate and over a substrate extending from under the gate. The deposition is non-conformal in that the oxide is thicker over the gate and over the substrate than it is on the side of the gate. A second non-conformal oxide is provided over the first non-conformal oxide. The second oxide is annealed in a boron-containing atmosphere, and the first oxide prevents boron diffusion from the second oxide into the gate and substrate. The second oxide may then serve as an etch stop, a CMP stop, or both.

2 Claims, 6 Drawing Sheets

METHOD TO FORM ETCH AND/OR CMP STOP LAYERS

TECHNICAL FIELD

The present invention relates generally to a doped non-conformal layer in a semiconductor device. More specifically, the present invention relates to a boron-doped oxide that can be used as a stopping layer for etching or chemical-mechanical planarization (CMP), among other uses.

BACKGROUND OF THE INVENTION

The formation of semiconductor devices (which may actually include conductive and insulative materials as well as semiconductive elements) often involves removing amounts of material included as part of the device. Occasionally, the desired result of removing material is a planarized surface. Other times, the desired result is an opening extending at least partway into the material. Examples of both results occur in the manufacture of dynamic random access memory (DRAM) devices, wherein transistor gates are formed over a semiconductor substrate. Once the gates are formed, an insulator can be deposited between and over them. The surface of this insulator is lowered to the general level of the gate top and planarized through etching or CMP. After that, a contact opening is etched through the insulator to a doped region of the semiconductor substrate that forms a transistor source or drain. This opening will subsequently be filled with conductive material, thereby allowing electrical communication with the doped substrate.

This process of forming a hole within an insulation layer and filling that hole with a conductive material is generally known as a damascene process. Damascene processes offer an alternative to etching away undesired portions of a continuous conductive layer and surrounding the remaining portions with insulation. Damascene processes used at various fabrication stages provide additional examples of where material removal is desired in the context of DRAM devices. For example, initially providing the damascene insulation layer may involve CMP before the hole is formed therein, and forming the hole usually involves an etching step.

During CMP or etching steps such as those described above, it is often preferable to provide some sort of CMP stop or etch stop at a location defining the extent of the removal process. Oftentimes this CMP/etch stop will be some sort of material that is more resistant if not completely immune to the CMP/etch process than is the material that is to be removed. For example, U.S. Pat. No. 5,485,035 by Lin et al. discloses using a first boron-doped oxide layer in carrying out a planarizing etch back (see Lin's FIG. 3) and a second boron-doped oxide layer to stop the via etch through an overlying insulating layer (Lin's FIG. 5).

Such oxides can be deposited by growing them from a surface in an oxidizing atmosphere or by conventional deposition methods, such as chemical vapor deposition (CVD). Another method of providing an oxide is a process known as Flowfill. Flowfill involves reacting silane with vaporized hydrogen peroxide. The reaction results in a gas which condenses as a liquid on a substrate cooled to about 0° C. A subsequent heat treatment dries the liquid to form $SiO_2$.

As for the application of Flowfill-created oxides, prior art discloses a CMP process that stops within a Flowfill layer, although it is unclear from one particular reference whether this is a matter of properly timing the CMP or due to some property of the oxide itself. See Sabine Penka, Integration Aspects of Flowfill and Spin-on-Glass Process for Sub-0.35 μm Interconnects, PROCEEDINGS OF THE IEEE 1998 INTERNATIONAL INTERCONNECT TECHNOLOGY CONFERENCE, at 271 (1998). Significantly, this reference further specifies that "Flowfill . . . need[s] to be enclosed by a base and a cap oxide." Other references further emphasize the presence of a base and cap. See, e.g., U. Höckele, et al., Flowfill-Process as a New Concept for Inter-Metal-Dielectrics, MATERIALS SCIENCE FORUM, at 235 (1998); A. Hass Bar-Ilan et al., A comparative study of sub-micron gap filling and planarization techniques, PROCEEDINGS OF THE SPIE—THE INTERNATIONAL SOCIETY FOR OPTICAL ENGINEERING, at 278–279 (1995); K. Beekmann et al., SUB-MICRON GAP FILL AND IN-SITU PLANARIZATION USING FLOW-FILL™ TECHNOLOGY, at 137 (1996). The base layer is an oxide provided by plasma-enhanced CVD (PECVD) and serves as an adhesion layer for the Flowfill oxide.

Concerning altering the properties of Flowfill layers, U.S. Pat. No. 5,985,770, also assigned to Micron Technology Inc., discloses gas phase doping of a Flowfill layer before or during the heat treatment that ultimately solidifies the Flowfill liquid into $SiO_2$.

Given the state of the prior art in terms of CMP and etch stops, there is a constant need in the art to find a new etch stop or CMP stop and new ways of making them. Moreover, there is also a need in the art to find new applications for and modifications of the Flowfill process.

SUMMARY OF THE INVENTION

Accordingly, exemplary embodiments of the current invention provide a doped non-conformal oxide. In a preferred exemplary embodiment, a non-conformal oxide that resists doping is initially provided by way of a Flowfill process. Next is provided a second non-conformal oxide that is configured to accept dopant more readily. Subsequently the second oxide is annealed in an atmosphere containing boron. Alternative method embodiments include other ways of flowing at least one of the oxides. Still other alternatives address other ways of providing non-conformal oxides, such as through a high-density plasma CVD. Yet other alternative exemplary embodiments address the use of a doped non-conformal oxide as an etch stop and/or a CMP stop.

DETAILED DESCRIPTION OF THE PREFERRED EMBODIMENT

Figure 1:
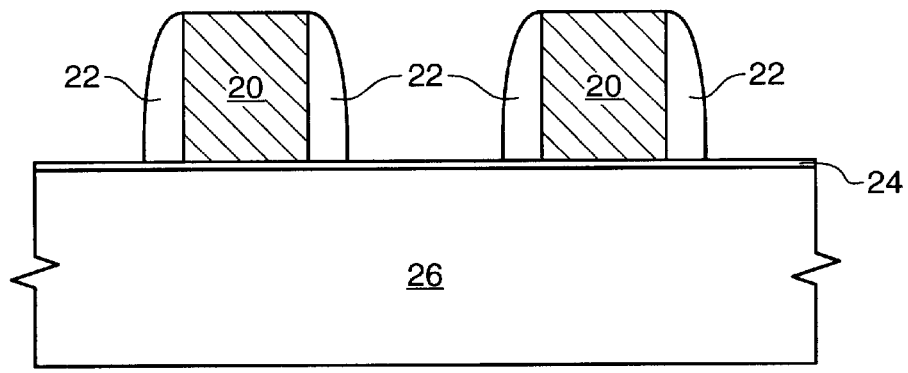
FIG. 1 depicts a cross section of an in-process DRAM as known in the prior art.

FIG. 1 depicts a portion of a wafer in the process of having DRAM devices formed thereon. Specifically, FIG. 1 shows two transistor gates 20 flanked by insulating spacers 22. The gates 20 may include one or more conductive layers and an insulating cap. Further, the transistor gates 20 are over a gate oxide 24 which, in turn, overlies a substrate 26. In the current application, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate" also refers to any supporting structure including, but not limited to, the semiconductive substrates described above.

Figure 2:
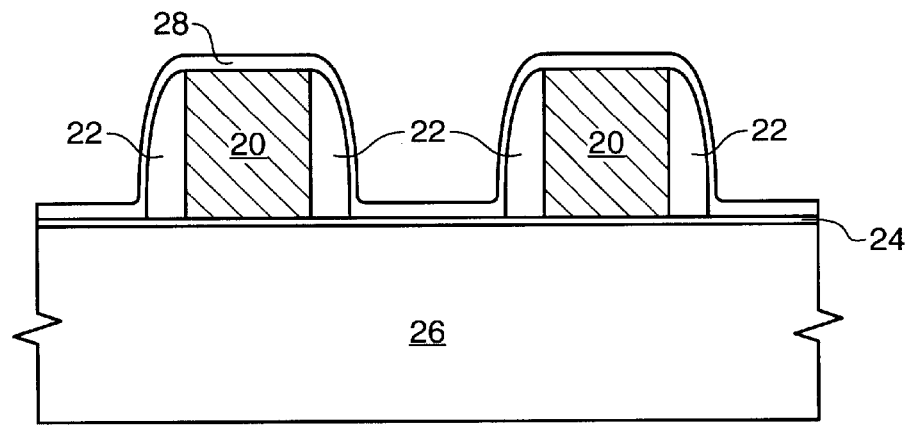
FIGS. 2–11 illustrate cross-sections of an in-process DRAM having undergone steps in exemplary method embodiments of the current invention. These figures also show various exemplary apparatus embodiments within the scope of the current invention.

FIG. 2 illustrates a step taken as part of an exemplary method embodiment of the current invention. A first oxide 28 is provided over the transistor gates. Preferably the first oxide 28 is provided by the Flowfill process mentioned above. More specifically, the first oxide 28 is provided by reacting silane ($SiH_4$) with hydrogen peroxide ($H_2O_2$) at a pressure of about 1 Torr, a substrate temperature of 0° C., an $SiH_4$ flow rate of about 100 sccm, and an $H_2O_2$ flow rate of about 0.6 g/minute. The result is silanol ($Si(OH)_4$)—a liquid that flows over the cooled substrate. Once deposited, heating the liquid $Si(OH)_4$ to about 450° C. forms solid $SiO_2$. As a result of this process, the first oxide 28 not only deposits on top of the gates 20 but also between them. However, the first oxide 28 is non-conformal in that horizontal portions are thicker than non-horizontal portions. Of further note is that this Flowfill process is used without necessarily providing an adhesion layer. In addition, the use of $SiH_4$ results in an oxide that will not readily accept dopant.

Figure 3:
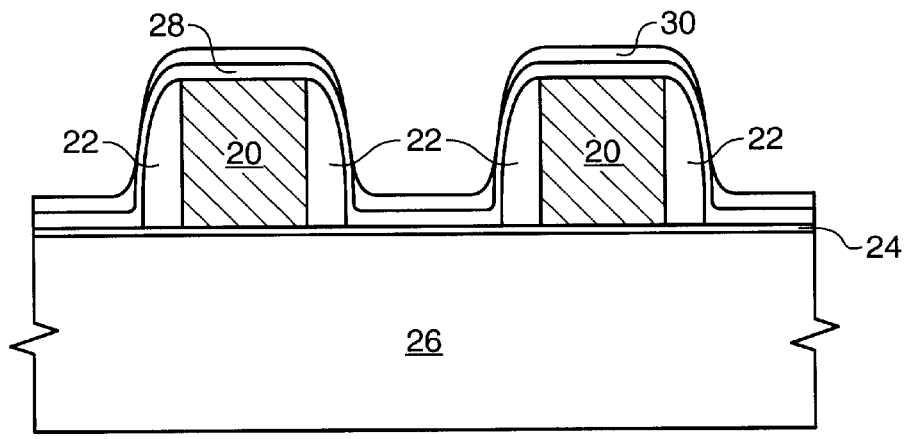

FIG. 3 illustrates that a second oxide 30 is subsequently deposited over the first oxide 28. Preferably, deposition occurs in situ—in the same chamber as the previous oxide deposition. For this second oxide 30, it is preferred to react methylsilane —$H_3SiCH_3$—with hydrogen peroxide —$H_2O_2$—under parameters similar to those described above. The result is a flowable material (plus organic by products). This material can be considered an oxide precursor in that it forms $SiO_2$ after being heated to about 450° C. Accordingly, such a thermal treatment is carried out, thereby forming the second oxide 30. Like the first oxide 28, second oxide 30 deposits non-conformally with respect to the underlying surface. For example, in the exemplary embodiment pictured, the thickness of the second oxide 30 over a particular horizontal surface is generally constant given the self-planarizing nature of the deposition. Regarding non-horizontal surfaces, the second oxide 30 will vary in thickness and, in fact, may not deposit at all on some non-horizontal surfaces. Acceptable exemplary thicknesses for the second oxide 30 in this embodiment include 500 to 1000 Angstrom-thick horizontal portions and 0–50 Angstrom-thick non-horizontal portions. Thus, in at least some embodiments, the location of the second oxide 30 is limited to discrete portions of the underlying support structure or structures.

Unlike the first oxide 28, this second oxide 30 is porous and will readily accept dopant. Without limiting the current invention, it is believed that this second oxide 30 will do so because of its porous nature. As for the creation of these pores, it is thought that the formation process described above results in gaps within the second oxide 30 that are bigger than the lattice constant defined by the Si—O bonds of that layer. These gaps, which may define lengths of 10 to 20 Angstroms and greater, may accommodate a dopant that is supplied in a later step. Accordingly, the term "pore" as used in this application, including the claims, is defined as a gap in a material, wherein the gap is bigger than the lattice constant of that material.

Figure 4:
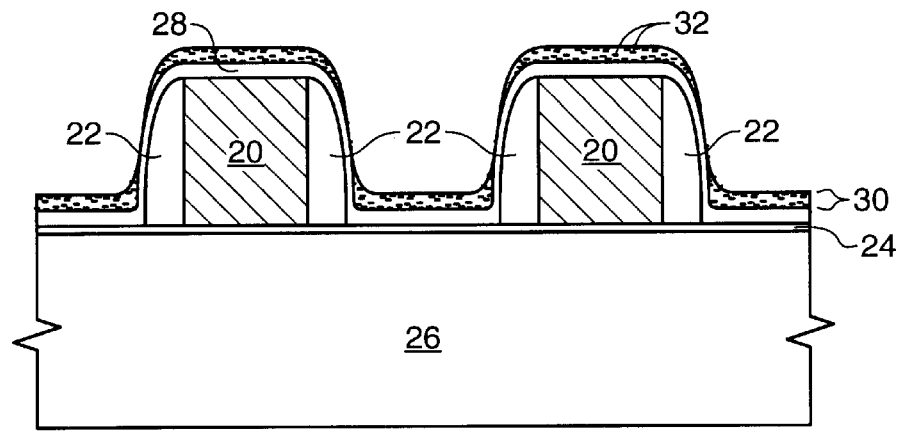

Accordingly, the second oxide 30 is subsequently doped with boron 32, the result of which is seen in FIG. 4. One way of doping is to anneal the second oxide 30 in an atmosphere containing boron. Exemplary parameters for such an anneal include an atmosphere wherein diborane ($B_2H_6$) contributes at least a partial pressure of the ambient; a temperature of 400–800° C.; a pressure ranging from 0.5 Torr to 760 Torr; and a process time ranging from 10 seconds to 5 minutes. The first oxide layer 28 prevents most if not all diffusion of boron into other portions of the in-process DRAM device.

Figure 5:
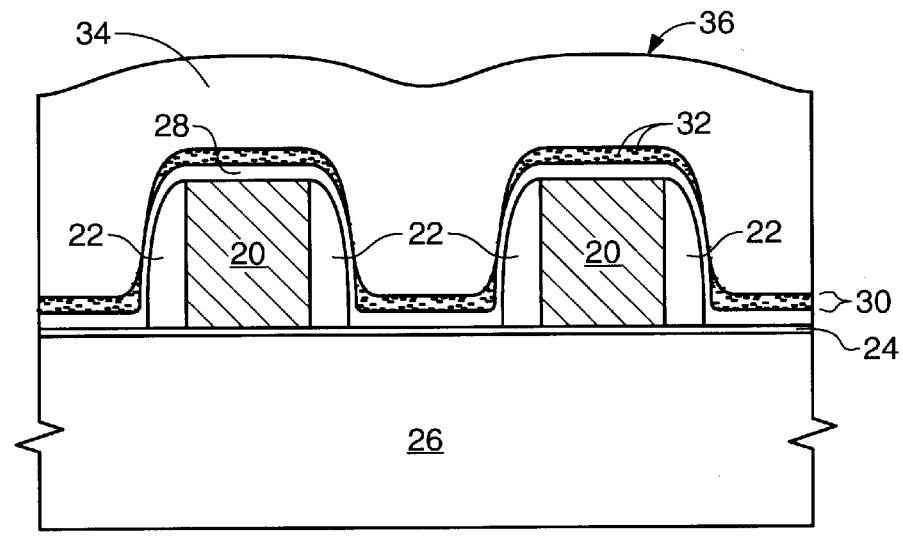
Figure 6:
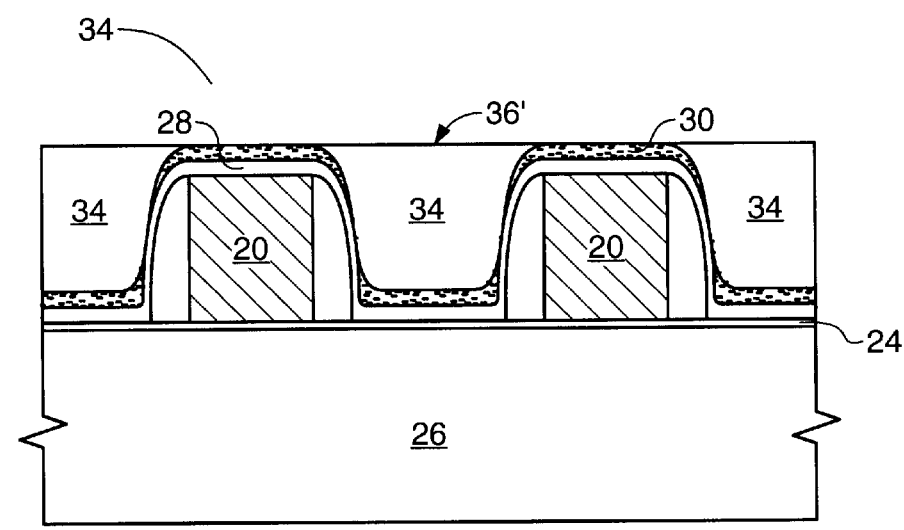

Next, an insulation layer 34 seen in FIG. 5 is layered over the in-process DRAM. This insulation layer is preferably formed of a glass such as borophosphosilicate glass (BPSG). The deposition of BPSG is a somewhat conformal process, resulting in an insulation layer 34 having a non-planarized surface 36. To achieve the desired planarized surface for that layer 34, a CMP process known in the art may be enacted. The portions of second oxide 30 atop the transistor gates 20, being harder to planarize than the overlying insulation layer 34, act as a CMP stop layer. The result, seen in FIG. 6, is an insulation layer 34 having a planarized surface 36' at the level defined by the second oxide 30 atop the gates 20.

Figure 7:
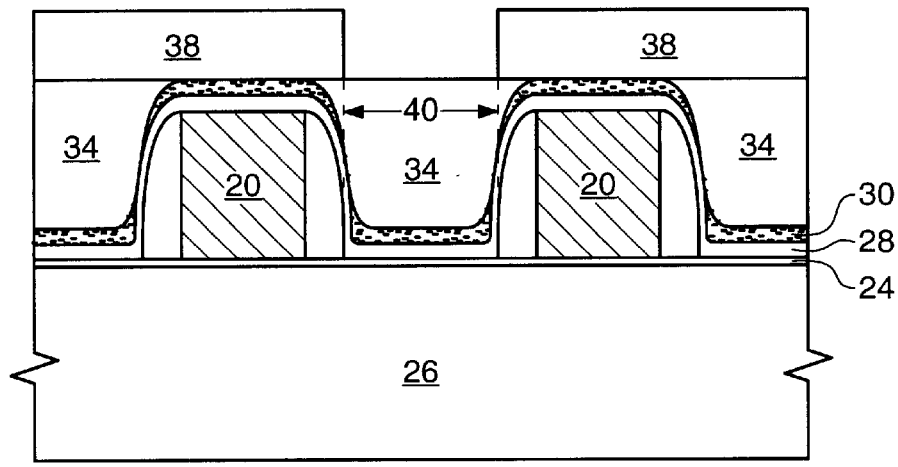
Figure 8:
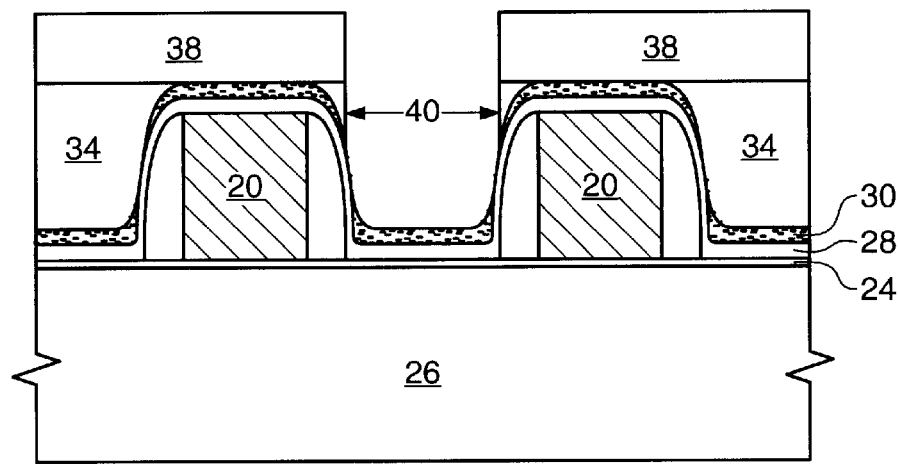

Moreover, the lower portions of the second oxide 30 may also serve to stop another removal process. For example, it may be desired to provide a contact between the transistor gates 20. To do so, FIG. 7 illustrates that a layer of photoresist 38 is deposited over insulation layer 34 and patterned to expose a contact site 40. A subsequent etching step removes the insulation layer 34 material from contact site 40 yet has greater difficulty in removing the second oxide 30 near the bottom of the contact site 40, as seen in FIG. 8. As an example, the in-process device can be exposed to a low-pressure HF vapor or a buffered HF solution at 23° C., which will etch BPSG to a greater degree than the boron-doped second oxide 30. The second oxide 30 may then be removed by a second etch. This second etch may take place in the form of another wet etch using HF. Alternatively, a reactive sputter etch or a plasma etch may be performed using gases such as $CHF_3$, $CF_4$, and $C_2F_6$. Exemplary plasma etch parameters include using $CF_4$ at a flow rate of 50 sccm, $CHF_3$ at a flow rate of 50 sccm, argon at a flow rate of 1000 sccm, a chamber pressure ranging from 0.2 to 0.002 torr, and an RF power of 750 W, for a time necessary to sufficiently remove enough of the second oxide 30. This etch may be used to remove the first oxide 28 and gate oxide 24 as well. Alternatively, separate etch steps may be applied to these oxides. Subsequent processing steps known in the art may be carried out to complete the DRAM.

Figure 9:
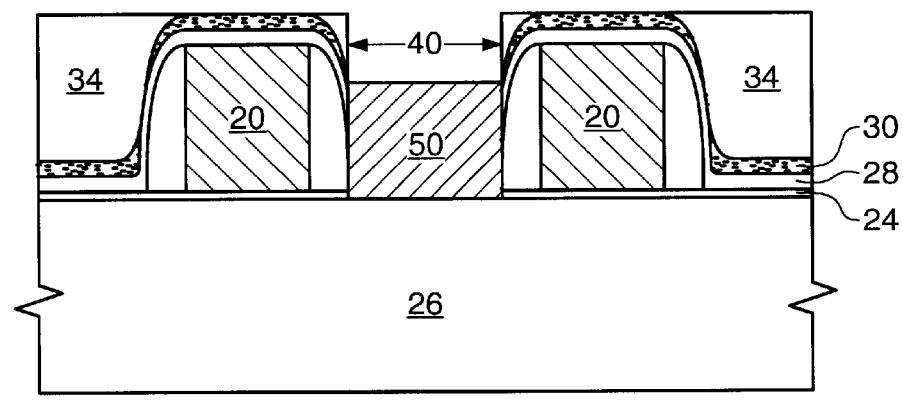
Figure 10:
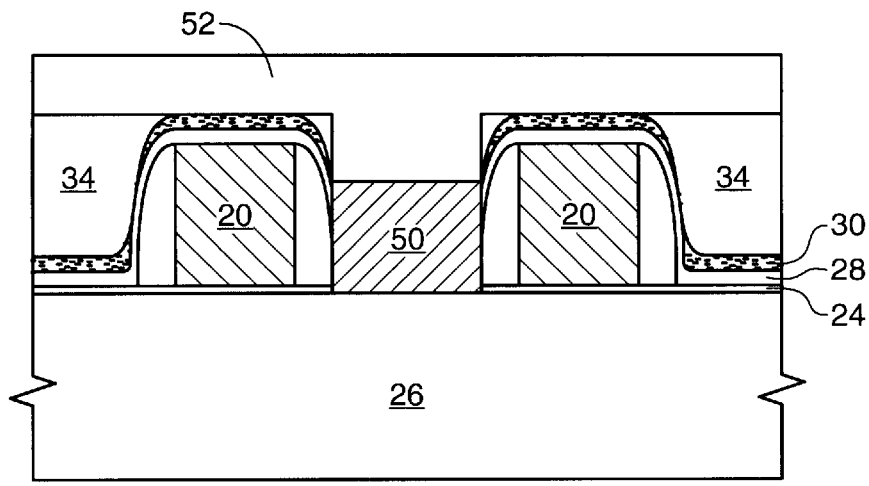
Figure 11:
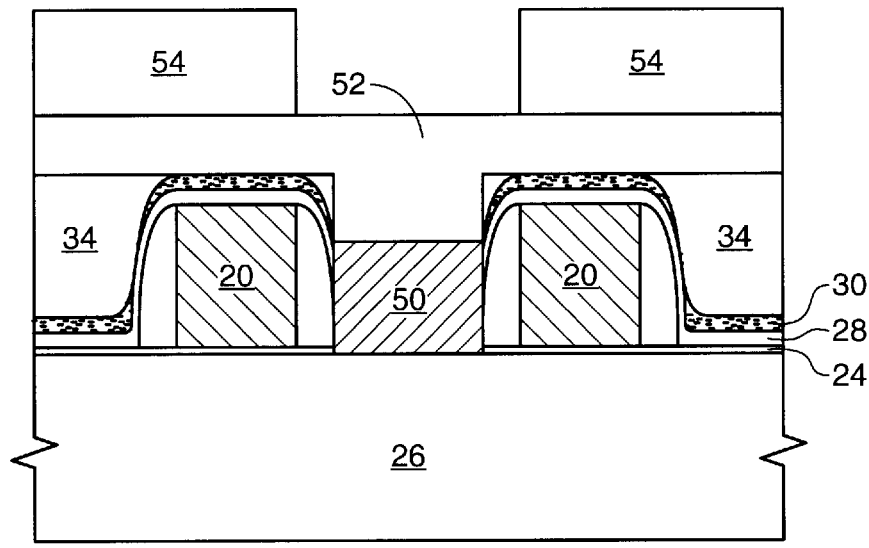

The subsequent processing steps, however, may lead to other exemplary embodiments involving a non-conformal boron-doped oxide. FIG. 9 illustrates that a polycrystalline plug 50 is eventually deposited within the contact site 40. Assuming the in-process DRAM device will be incorporating capacitors using high-K dielectrics, it will be preferred to recess the plug 50 so that its surface does not reach the top of the contact site 40. As shown in FIG. 10, a non-conformal insulator 52, which can be formed in a manner such as that used to form the second oxide 30 above, may be deposited and doped with boron. Thereafter, a damascene process may be used to define a container in which a capacitor will appear. For example, a layer of insulation 54 as shown in FIG. 11 can be deposited and etched according to a patterned mask (not shown), with the non-conformal insulator 52 used to stop that etch. An additional etch may then be used to clear the boron-doped non-conformal insulator 52 from above the plug 50. However, this etch is optional. Regardless of whether this optional etch is performed, processing may continue, including steps that provide a capacitor within the container.

Figure 12:
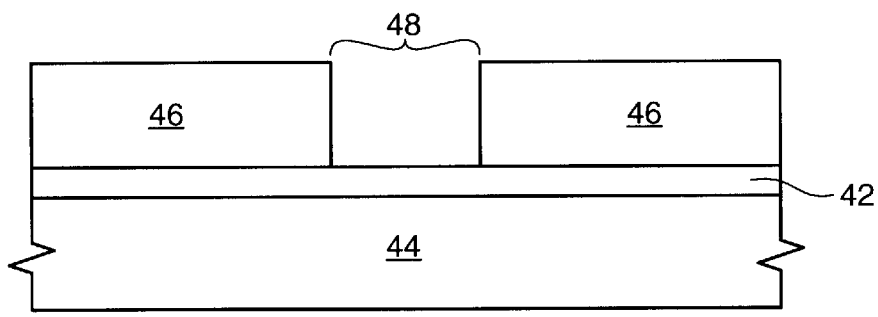
FIG. 12 illustrates a modified damascene process included as an exemplary embodiment of the current invention.

FIG. 12 demonstrates that non-conformal etch stops apply to other damascene-created structures as well. In that figure, an oxide layer 42 has been deposited over a support surface 44 (assumed to be a BPSG layer) and subsequently annealed in a boron- containing atmosphere. An insulating layer 46 is then deposited thereover and patterned according to a mask (not shown) to form an opening 48 configured to receive a conductive material. The etch process used to form the opening 48 will generally stop once the oxide layer 42 is reached.

Figure 13:
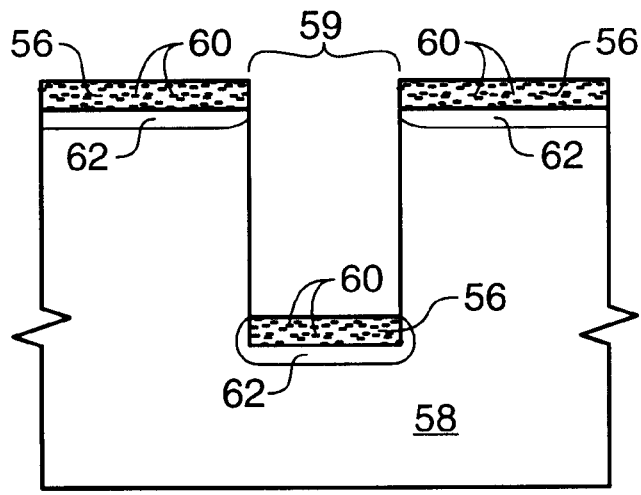
FIG. 13 shows a cross-section of an in-process semiconductor device portion having undergone steps included in another exemplary embodiment of the current invention.

The current invention also includes within its scope exemplary embodiments wherein the doped non-conformal oxide is used for purposes other than stopping etching or CMP. In FIG. 13, for example, a non-conformal oxide 56 has been deposited onto the surface of a material 58 and at the bottom of a trench 59 defined by that material 58. The material 58 is assumed to be BPSG but could be another material. Annealing the non-conformal oxide 56 in diborane using the parameters discussed above implants boron 60 into the non-conformal oxide 56. Further annealing of that oxide 56 can drive the boron 60 into adjacent regions 62 of the material 58. The non-conformal oxide 56 may then be removed, leaving a trench 59 having a doped bottom and substantially undoped sides, and the material 58 around the trench 59 having a doped surface.

Figure 14:
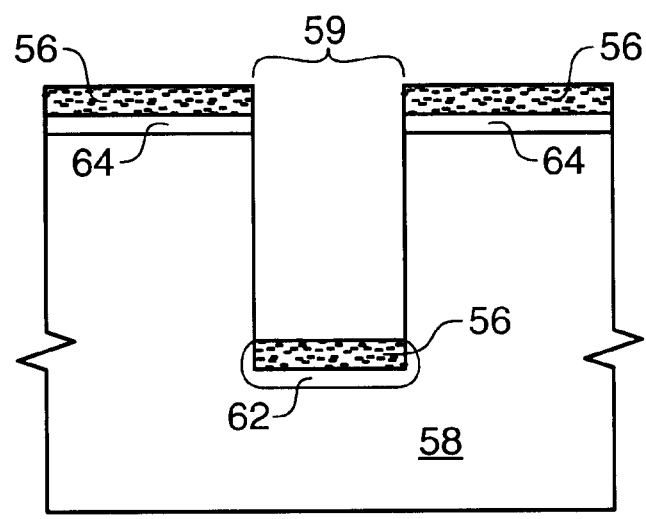
FIG. 14 shows a cross-section of an in-process semiconductor device portion having undergone steps included in an alternative exemplary embodiment of the current invention.

Alternatively, if it is not desired to dope the surface of material 58, a barrier layer 64 such as a nitride may be deposited before etching the trench 59. The result after annealing the boron-doped non-conformal oxide 56 is depicted in FIG. 14. Yet another alternative is to remove the doped surface by way of a planarization step, such as CMP, performed before annealing.

Figure 15:
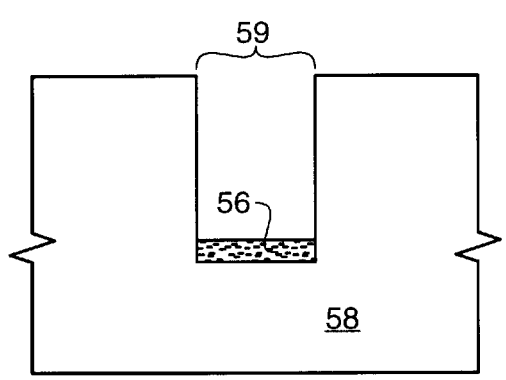
FIG. 15 is a cross-section of an exemplary apparatus embodiment of the current invention.
Figure 16:
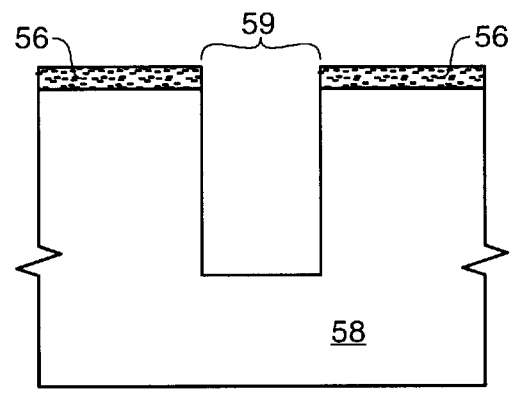
FIG. 16 is a cross-section of another exemplary apparatus embodiment of the current invention.
Figure 17:
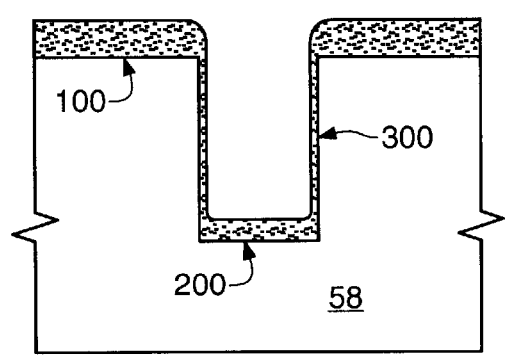
FIG. 17 is a cross-section of still another exemplary apparatus embodiment of the current invention.

Still another alternative is to provide process parameters such that the deposition of the non-conformal oxide on the top of the material 58 is reduced or perhaps even eliminated. For example, if methylsilane is reacted with hydrogen peroxide at room temperature (about 20° C.), then the non-conformal oxide 56 will be thicker at the bottom of trench 59 than amounts, if any, at the top, as seen in FIG. 15. Further, it is also believed that, as the temperature during deposition approaches 100° C., the non-conformal oxide will deposit a thicker amount on the surface than at the bottom of a trench 59 in that surface, an extreme result of such being depicted in FIG. 16. Thus, as seen in FIG. 17, the current invention includes within its scope exemplary embodiments wherein a non-conformal doped oxide has different thicknesses on a first horizontal surface 100, a second horizontal surface 200, and a non-horizontal surface 300 of a device, wherein such thicknesses are determined by process parameters including the ones addressed above. Further, the thickness at any of these regions may be reduced to zero.

Figure 18:
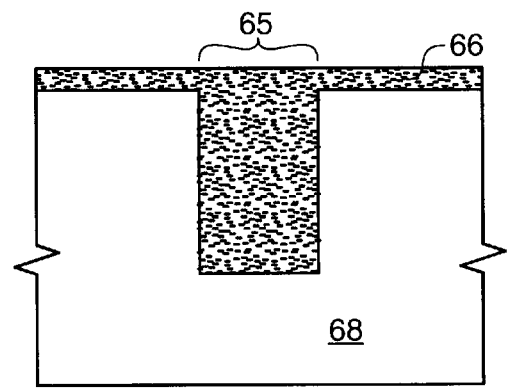
FIG. 18 shows a cross-section of an in-process semiconductor device portion having undergone steps included in yet another exemplary embodiment of the current invention.

In other cases, it may simply be desired to fill a trench 65 with a doped oxide, and embodiments of the current invention can accommodate such cases. A non-conformal oxide 66 can be deposited and subsequently doped, using, for example, the methylsilane deposition/diborane anneal steps discussed above. The result is seen in FIG. 18. The oxide 66 can be subsequently etched or CMP'd to make the oxide 66 generally level with the surface of support material 68. Currently, borosilicate glass (BSG) is deposited in such trenches by way of conventional means, but as trenches become narrower in width, standard BSG deposition methods may not work. Thus, this exemplary embodiment offers an alternative method for filling trenches with a boron-doped insulator. In fact, the boron-doped insulator in this and other exemplary embodiments could be considered to be a low dielectric constant (low-K) BSG, wherein a low dielectric constant is considered to be at most 3. Accordingly, exemplary embodiments of the current invention have applications in other contexts where BSG or other low-K dielectrics are used. For example, a doped non-conformal oxide could be used as an interlayer dielectric (ILD).

In addition, while it is preferred to deposit the oxide by heating the product of a methylsilane/hydrogen peroxide reaction, the current invention includes within its scope exemplary embodiments that provide a non-conformal oxide by other ways. For example, another way to flow the oxide onto the underlying layer is through a spin-on-glass (SOG) process. The SOG process involves depositing a suspension of glass particles in an inorganic carrier onto a spinning substrate. Conventional photoresist tools can be used to achieve such a deposition. The inorganic carrier is then driven off of the substrate using a thermal process, and the remaining glass is reflowed to fill spaces in the underlying topography and to planarize the glass surface.

Another way of providing a non-conformal oxide is through the use of a high-density plasma (HDP) CVD process. In such a process, plasma gases including silicon-containing, oxygen-containing, and nonreactive gases (e.g. a noble gas) are used to deposit an oxide while simultaneously etching the oxide to prevent gaps from forming in the oxide material. The density of the plasma is greater than 10 ions per $cm^3$. Exemplary parameters include an ambient of $O_2$ (flowed at a rate of 120–500 sccm), $SiH_4$ (flowed at a rate of 80–250 sccm), and Ar (flowed at a rate of 0–50 sccm); an RF bias at 13.56 MHz; a temperature ranging from 350–700° C.; and a bias power ranging from 0 to 2000 W. Moreover, other CVD processes could be used to provide a non-conformal layer.

In addition, it is not necessary that the dopant be boron. Exemplary embodiments of the current invention include those in which at least one other impurity replaces or is added along with boron. It is noted that U.S. Pat. No. 5,985,770 discussed above discloses doping the oxide precursor with various materials before and during formation of the oxide layer. For example, application '987 indicates that phosphorous doping can be accomplished using $PH_3$, phosphates, or phosphites; fluorine doping can involve $NF_3$ or $F_2$; carbon may serve as the dopant using $C_2H_6$, trimethyl silane (($CH_3)_3SiH$) or $CH_4$; and nitrogen may dope the oxide using $NF_3$ or $NH_3$. The current invention includes within its scope exemplary embodiments that involve doping a non-conformal oxide after its formation with the dopants above (either alone or in combination) by using precursor gases such as the ones above (again either alone or in combination). More specific exemplary embodiments include doping one portion of the non-conformal oxide with a first dopant and a second portion of the oxide with a second dopant. Appropriate masking of the portions can be used to allow for such selective doping.

Furthermore, in embodiments wherein a diffusion barrier layer (such as the first oxide 28) is preferred, it is not necessary that the difflusion barrier be deposited in a non-conformal manner. Other exemplary embodiments allow for the barrier layer to be provided through standard methods resulting in a conformal layer. For example, an SiO$_2$ barrier layer could be provided under known conformal CVD parameters. Alternatively, a conformal layer of tetraethylorthosilicate (TEOS)-based glass could be layered before the non-conformal layer is provided and subsequently doped.

Given the variety of alternative embodiments described above, one skilled in the art can appreciate that, although specific embodiments of this invention have been described above for purposes of illustration, various modifications may be made without departing from the spirit and scope of the invention. Returning to the first exemplary embodiment described above, for instance, the first oxide under the doped second oxide is preferred to help prevent diffusion into other portions of the DRAM. However, the first oxide is not required, as careful processing can dope the second oxide without having the dopant diffuse beyond the oxide. Thus, embodiments without the first oxide fall within the scope of the invention. Further, as an addition to or an alternative to the preferred monomethylsilane/peroxide reaction, the current invention includes within its scope the use of other chemicals to provide a non-conformal oxide, including (but not limited to) dimethylsilane, trimethylsilane, tetramethylsilane, pentamethyldisilane, and combinations of chemicals. Moreover, while exemplary embodiments of the current invention have been illustrated in the context of a DRAM, these and other embodiments apply to semiconductor devices in general. Accordingly, the invention is not limited except as stated in the claims.

What is claimed is:

1. A memory device, comprising:

a circuit device defining a horizontal surface and a non-horizontal surface;

a porous oxide over said circuit device, said porous oxide having a first thickness extending perpendicularly from said horizontal surface and a second thickness extending generally perpendicularly from said non-horizontal surface, wherein said second thickness is different from said first thickness, wherein said porous oxide comprises an oxide defining at least one pore, wherein said porous oxide comprises a plurality of silicon atoms and a plurality of oxygen atoms, wherein said plurality of silicon atoms and said plurality of oxygen atoms define a lattice constant, wherein at least one dimension of said at least one pore is greater than said lattice constant, and wherein said dimension of said at least one pore is at least 10 angstroms; and a dopant in at least one pore.

2. The memory device in claim 1, wherein said dopant consists of a selection from boron, carbon, phosphorous, fluorine, nitrogen, and combinations thereof.

* * * * *

UNITED STATES PATENT AND TRADEMARK OFFICE
CERTIFICATE OF CORRECTION

PATENT NO. : 6,348,706 B1
DATED : February 19, 2002
INVENTOR(S) : Gurtej S. Sandhu It is certified that error appears in the above-identified patent and that said Letters Patent is hereby corrected as shown below:

Column 1,
Line 58, delete the term "an".

Column 6,
Line 39, delete "10" and replace it with -- $10^{10}$ --.

Column 7,
Line 3, delete "difflusion" and replace it with -- diffusion --.

Signed and Sealed this

Fourteenth Day of January, 2003

JAMES E. ROGAN
*Director of the United States Patent and Trademark Office*